United States Patent
Kuroi et al.

(10) Patent No.: US 9,475,983 B2
(45) Date of Patent: Oct. 25, 2016

(54) FLUORESCENCE LIGHT EMITTING ELEMENT COMPRISING A PHOSPHOR LAYER INCLUDING PHOSPHORS AND A BINDER MADE OF AN INORGANIC MATERIAL

(71) Applicant: SEIKO EPSON CORPORATION, Tokyo (JP)

(72) Inventors: Kiyoshi Kuroi, Nagahama (JP); Toshiaki Hashizume, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 59 days.

(21) Appl. No.: 14/525,363

(22) Filed: Oct. 28, 2014

(65) Prior Publication Data

US 2015/0116671 A1  Apr. 30, 2015

(30) Foreign Application Priority Data

Oct. 31, 2013 (JP) ................. 2013-226261

(51) Int. Cl.
| | |
|---|---|
| H01L 33/50 | (2010.01) |
| G03B 21/20 | (2006.01) |
| C09K 11/02 | (2006.01) |
| G03B 21/00 | (2006.01) |
| C09K 11/77 | (2006.01) |

(52) U.S. Cl.
CPC ............ *C09K 11/02* (2013.01); *C09K 11/7774* (2013.01); *G03B 21/005* (2013.01); *G03B 21/204* (2013.01); *H01L 33/501* (2013.01)

(58) Field of Classification Search
CPC .... G03B 21/204; H01L 33/501; C09K 11/02
See application file for complete search history.

(56) References Cited

U.S. PATENT DOCUMENTS

| | | | | |
|---|---|---|---|---|
| 7,361,865 B2* | 4/2008 | Maki | ................. | H01L 21/67103 219/444.1 |
| 8,662,678 B2* | 3/2014 | Hirata | ..................... | G03B 21/20 353/94 |
| 8,835,951 B2* | 9/2014 | Ichikawa | ................ | H01L 24/32 257/98 |
| 8,956,028 B2* | 2/2015 | Takahashi | ............ | G03B 21/204 362/257 |
| 8,979,314 B2* | 3/2015 | Maemura | .............. | H01L 33/507 362/259 |
| 9,082,946 B2* | 7/2015 | Vdovin | ................. | H01L 33/507 |
| 9,157,604 B2* | 10/2015 | Woelfing | ................. | F21K 9/56 |
| 9,163,791 B2* | 10/2015 | Maemura | .............. | H01L 33/507 |
| 9,170,475 B2* | 10/2015 | Maes | ................... | G03B 21/204 |
| 9,184,352 B2* | 11/2015 | Kojima | ................. | C09K 11/02 |

(Continued)

FOREIGN PATENT DOCUMENTS

| | | |
|---|---|---|
| JP | A-08-304739 | 11/1996 |
| JP | A-2005-277331 | 10/2005 |

(Continued)

OTHER PUBLICATIONS

Apr. 14, 2015 Extended Search Report issued in European Application No. 14191323.6.

*Primary Examiner* — Bao-Luan Le
(74) *Attorney, Agent, or Firm* — Oliff PLC

(57) ABSTRACT

A fluorescence light emitting element includes a phosphor layer that includes phosphors and a binder made of an inorganic material. A thermal conductivity B of the binder is larger than 1.88 times a thermal conductivity A of the phosphors. When the volume of the phosphors included in the phosphor layer is X and the volume of the binder included in the phosphor layer is Y, a relationship of X/Y>1/2 is satisfied.

18 Claims, 4 Drawing Sheets

(56) References Cited

U.S. PATENT DOCUMENTS

| | | | |
|---|---|---|---|
| 9,206,959 B2* | 12/2015 | Kashiwagi | F21V 9/16 |
| 9,255,691 B2* | 2/2016 | Motoya | F21V 9/08 |
| 2005/0211991 A1 | 9/2005 | Mori et al. | |
| 2005/0214573 A1 | 9/2005 | Den et al. | |
| 2005/0252903 A1* | 11/2005 | Maki | H05B 3/143 219/270 |
| 2008/0149166 A1* | 6/2008 | Beeson | H01L 31/02322 136/248 |
| 2011/0199580 A1* | 8/2011 | Hirata | G03B 21/20 353/31 |
| 2011/0248304 A1* | 10/2011 | Ichikawa | H01L 24/32 257/98 |
| 2012/0178193 A1 | 7/2012 | Lei et al. | |
| 2012/0201030 A1* | 8/2012 | Yuan | G02B 26/008 362/293 |
| 2012/0275134 A1* | 11/2012 | Takahashi | G03B 21/204 362/84 |
| 2013/0163225 A1 | 6/2013 | Nakatsu et al. | |
| 2013/0201456 A1* | 8/2013 | Kashiwagi | F21V 9/16 353/31 |
| 2013/0201458 A1* | 8/2013 | Kashiwagi | F21K 9/56 353/85 |
| 2013/0286359 A1* | 10/2013 | Motoya | G03B 21/204 353/31 |
| 2013/0308332 A1* | 11/2013 | Woelfing | F21K 9/56 362/553 |
| 2013/0334559 A1* | 12/2013 | Vdovin | H01L 33/507 257/98 |
| 2013/0335989 A1 | 12/2013 | Sato et al. | |
| 2014/0240676 A1* | 8/2014 | Maes | G03B 21/204 353/20 |
| 2015/0009649 A1* | 1/2015 | Jagt | H01L 33/507 362/84 |
| 2015/0118773 A1* | 4/2015 | Kojima | C09K 11/02 438/29 |

FOREIGN PATENT DOCUMENTS

| | | |
|---|---|---|
| JP | A-2012-074273 | 4/2012 |
| JP | A-2012-190555 | 10/2012 |

* cited by examiner

FLUORESCENCE LIGHT EMITTING ELEMENT COMPRISING A PHOSPHOR LAYER INCLUDING PHOSPHORS AND A BINDER MADE OF AN INORGANIC MATERIAL

BACKGROUND

1. Technical Field

The present invention relates to a fluorescence light emitting element, a light source device, and a projector.

2. Related Art

A fluorescence light emitting element that includes a phosphor layer in which phosphors are dispersed in silicone resin is known (for example, JP-A-2012-74273).

The thermal conductivity of the silicone resin (binder) is generally lower than the thermal conductivity of the phosphors. Consequently, as the ratio of the volume of the binder in the phosphor layer becomes large in the above-mentioned phosphor layer in which the phosphors are dispersed in the silicone resin, the thermal conductivity of the entire phosphor layer decreases noticeably, and the thermal resistance of the phosphor layer increases. As the thermal resistance increases, heat generated by heat radiation of the phosphors is easily accumulated in the phosphor layer. Thus, for example, a light emission characteristic of the phosphors may decrease, or the phosphors may be damaged due to the accumulated heat.

In JP-A-2012-74273, in order to solve the above-mentioned problems, the compounding ratio of the phosphors to the silicone resin is adjusted, but this technique is not sufficient.

SUMMARY

An advantage of some aspects of the invention is to provide a fluorescence light emitting element capable of reducing a temperature increase of a phosphor layer, a light source device including such a fluorescence light emitting element, and a projector including such a light source device.

An aspect of the invention is directed to a fluorescence light emitting element including: a phosphor layer that includes phosphors and a binder made of an inorganic material, in which a thermal conductivity B of the binder is larger than 1.88 times a thermal conductivity A of the phosphors, and a relationship of X/Y>1/2 is satisfied. Here, X denotes the volume of the phosphors included in the phosphor layer, and Y denotes the volume of the binder included in the phosphor layer.

According to the fluorescence light emitting element according to the aspect of the invention, since the binder is made of the inorganic material, the thermal conductivity of the entire phosphor layer is high, compared with a case where silicone resin is used as the binder. Further, since the thermal conductivity of the binder is larger than 1.88 times the thermal conductivity of the phosphors, even though the binder is introduced to the phosphor layer, it is possible to obtain a phosphor layer having a sufficiently high thermal conductivity. Thus, it is possible to reduce an increase in the thermal resistance in the thickness direction of the phosphor layer.

Excitation light incident on the phosphor layer includes a component that is not applied to the phosphors. As the volume concentration of the phosphors included in the phosphor layer decreases, the amount of the component that is not applied to the phosphors increases, leading to a decrease in use efficiency of the excitation light. As a result, the light emission intensity of the fluorescence light emitting element may decrease.

In contrast, according to the fluorescence light emitting element according to the aspect of the invention, since the ratio of the volume of the phosphors with respect to the volume of the binder is larger than 1/2, the volume concentration of the phosphors in the phosphor layer is sufficiently large. Thus, it is possible to efficiently irradiate the phosphors with the excitation light to obtain a sufficiently high light emission intensity.

Accordingly, according to the fluorescence light emitting element according to the aspect of the invention, it is possible to obtain a fluorescence light emitting element having a high thermal conductivity of the phosphor layer and capable of emitting strong light.

A relationship of $\alpha \geq 2.4736 \times (B/A)^{-1.432} \times 100$ may be satisfied. Here, $\alpha$ [vol %] denotes the volume concentration of the phosphors included in the phosphor layer.

According to this configuration, it is possible to set the thermal resistance of the phosphor layer to be equal to or lower than the thermal resistance of a phosphor layer that contains the phosphors only. Thus, it is possible to obtain a fluorescence light emitting element capable of reducing a temperature increase of the phosphor layer.

The binder may be selected from a group consisting of aluminum oxide, magnesium oxide, silicon carbide, and aluminum nitride.

According to this configuration, it is possible to obtain a fluorescence light emitting element capable of reliably reducing temperature increase of the phosphor layer.

The binder may be made of aluminum oxide, and the volume concentration of the phosphors may be 66 vol % or more.

According to this configuration, it is possible to set the thermal resistance of the phosphor layer to be equal to or lower than the thermal resistance of the phosphor layer that contains the phosphors only.

The volume concentration of the phosphors may be 75 vol % or more and 95 vol % or less.

According to this configuration, it is possible to sufficiently decrease the thermal resistance of the phosphor layer.

The binder may be made of magnesium oxide, and the volume concentration of the phosphors may be 50 vol % or more and 80 vol % or less.

According to this configuration, it is possible to sufficiently decrease the thermal resistance of the phosphor layer.

Another aspect of the invention is directed to a light source device including the fluorescence light emitting element described above.

According to the light source device according to the aspect of the invention, since the fluorescence light emitting device described above is provided, it is possible to reduce a decrease in the fluorescence intensity due to heat accumulation in the phosphor layer. Accordingly, according to the light source device according to the aspect of the invention, it is possible to obtain a light source device having excellent reliability.

Still another aspect of the invention is directed to a projector including: the light source device described above; an optical modulation device that modulates light emitted from the light source device to form image light; and a projection optical system that projects the light emitted from the optical modulation device.

According to the projector according to the aspect of the invention, since the light source device described above is provided, it is similarly possible to obtain a projector having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a projector according to embodiments of the invention will be described with reference to the accompanying drawings.

The scope of the invention is not limited to the following embodiments, and various modifications may be arbitrarily made in the scope of the technical idea of the invention. Further, in the following drawings, for ease of understanding, the scale, number or the like of respective structures may be different from actual structures.

Figure 1:
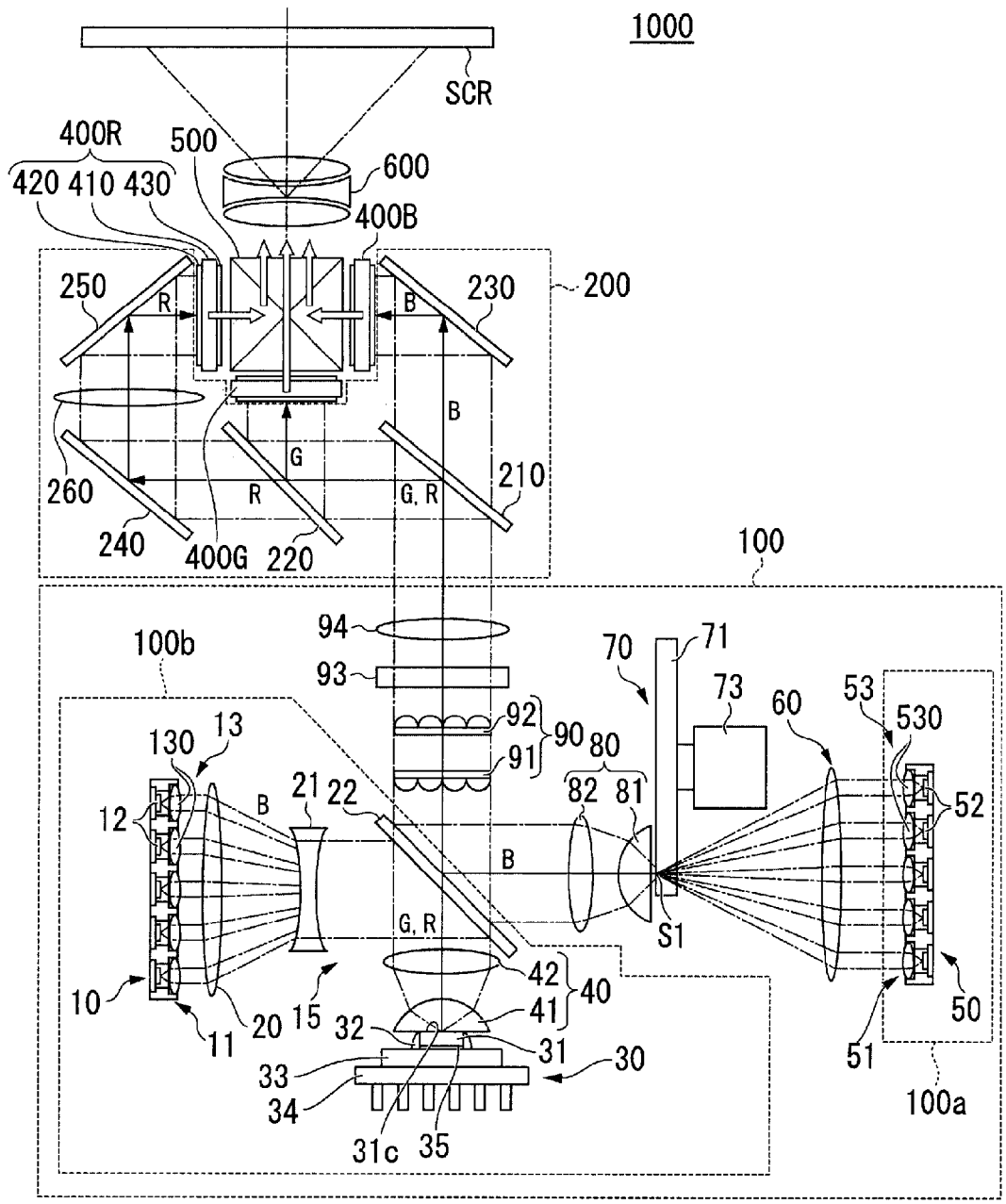
FIG. 1 is a schematic configuration diagram illustrating a projector according to an embodiment of the invention.

FIG. 1 is a schematic configuration diagram illustrating a projector 1000 of an embodiment of the invention.

The projector 1000 of the present embodiment includes an illuminating device 100, a color separation light guide optical system 200, an optical modulation device 400R, an optical modulation device 400G, an optical modulation device 400B, a cross dichroic prism 500, and a projection optical system 600.

The illuminating device 100 includes a first light source device 100a, a first condensing lens 60, a rotary diffusion plate 70, a first pickup optical system 80, a second light source device (light source device) 100b, a fly-eye integrator 90, a polarization conversion element 93, and a second collimating lens 94.

The first light source device 100a includes a first light source 50 and a first collimator lens array 53.

The second light source device 100b includes a second light source 10, a second collimator lens array 13, a second condensing lens 20, a first collimating lens 21, a dichroic mirror 22, a second pickup optical system 40, and a fluorescence light emitting element 30.

The first light source 50 is a light source array that includes a first base 51 and plural first solid light-emitting elements 52 that are two-dimensionally arranged in parallel on the first base 51. The first solid light-emitting element 52 emits blue light to be reflected by the dichroic mirror 22. In the present embodiment, the first solid light-emitting element 52 is a semiconductor laser that emits blue laser light (light emission intensity peak: about 450 nm), but the first solid light-emitting element 52 may emit light having a peak wavelength other than 450 nm as long as the light is reflected by the dichroic mirror 22. Further, the first solid light-emitting element 52 may be a light-emitting element, such as an LED, that emits non-laser light.

The first collimator lens array 53 includes plural first micro-lenses 530 corresponding to the respective first solid light-emitting elements 52 one to one. The plural first micro-lenses 530 are arranged in parallel on the first base 51. Each first micro-lens 530 is provided on a light axis of the blue light emitted from the first solid light-emitting element 52 corresponding thereto, and collimates the blue light to be emitted therefrom. Thus, the blue laser light is emitted from the first light source device 100a. The collimated light is condensed by the first condensing lens 60 formed of a convex lens, and is emitted toward the rotary diffusion plate 70.

The rotary diffusion plate 70 that is a diffusion member is a transmission-type rotary diffusion plate that diffuses the incident blue light and outputs the diffused blue light from a side opposite to an incident side. The rotary diffusion plate 70 includes a substrate 71 that is a diffusion member rotationally driven by a motor 73. As the substrate 71, a known diffusion plate, for example, a ground glass, a holographic diffuser, a plate obtained by performing a blast treatment on a front surface of a transparent substrate, a plate obtained by dispersing a scattering material such as beads in a transparent substrate to scatter light by the scattering material, or the like may be used. In the embodiment, a disk is used as the substrate 71, but the shape of the substrate 71 is not limited to the disk. The rotary diffusion plate 70 relatively moves with respect to a region (light irradiation region) S1 irradiated with the blue light so that a portion (irradiation target portion) irradiated with the blue light draws a circle as the substrate 71 is rotationally driven.

The light output from the rotary diffusion plate 70 is incident on the first pickup optical system 80.

The first pickup optical system 80 is disposed on an optical path between the dichroic mirror 22 and the rotary diffusion plate 70. The first pickup optical system 80 includes a first lens 81 that is a pickup lens to which the light from the rotary diffusion plate 70 is incident, and a second lens 82 that collimates the light output from the first lens 81. The first lens 81 is formed of a plano-convex lens that has a planar light-incident surface and a convex light-emission surface, and the second lens 82 is formed of a convex lens, for example. The first pickup optical system 80 allows the light from the rotary diffusion plate 70 to be incident on the dichroic mirror 22 in an approximately collimated state.

In the first pickup optical system 80, the refractive index or the shape of a lens to be used is determined according to a spread of the blue light output from the rotary diffusion plate 70. Further, the number of lenses is not limited to two, and may be one, or three or more.

The dichroic mirror 22 is disposed on the optical path of the light emitted from the first pickup optical system 80, in which a front surface thereof forms an angle of about 45° with respect to an optical path direction. The surface of the dichroic mirror 22 to which the light is incident is directed toward the fly-eye integrator 90. The dichroic mirror 22 bends the optical path of the blue light incident from the first pickup optical system 80 by 90° to be reflected toward the fly-eye integrator 90.

The second light source 10 includes a second base 11, and plural second solid light-emitting elements 12 that are arranged on the second base 11. The second solid light-emitting element 12 is a light source that emits excitation light for exciting the phosphor layer 31 provided in the fluorescence light emitting element 30. In the present embodiment, the second solid light-emitting element 12 is an LED that emits blue light (light emission intensity peak: about 450 nm) as the excitation light, but as long as the light has a wavelength capable of exciting the phosphor layer 31, the second solid light-emitting element 12 may emit light having a peak wavelength other than 450 nm. Further, the second solid light-emitting element 12 may be a semiconductor laser.

The second collimator lens array 13 includes plural second micro-lenses 130 corresponding to the respective second solid light-emitting elements 12 one to one. The plural second micro-lenses 130 are arranged in parallel on the second base 11. Each second micro-lens 130 is provided on a light axis of the excitation light emitted from the corresponding second solid light-emitting element 12 to collimate the excitation light. The excitation light output from the second collimator lens array 13 is condensed by the second condensing lens 20 formed of a convex lens.

The first collimating lens 21 formed of a biconcave lens is disposed on an optical path of the excitation light between the second condensing lens 20 and the dichroic mirror 22. The first collimating lens 21 is disposed between the second condensing lens 20 and a focal position in the second condensing lens 20, collimates the excitation light incident from the second condensing lens 20, and emits the collimated excitation light to the dichroic mirror 22.

The dichroic mirror 22 is disposed on the optical path of the light output from the first collimating lens 21, in which a front surface thereof forms an angle of about 45° with respect to an optical path direction of the light output from the first collimating lens 21. The surface of the dichroic mirror 22 to which the light output from the first collimating lens 21 is incident is directed toward the second pickup optical system 40. The dichroic mirror 22 bends the optical path of the excitation light (blue light component) incident from the first collimating lens 21 by 90° to be reflected toward the second pickup optical system 40, and transmits fluorescence light (red light component and green light component) incident from the second pickup optical system 40.

The second pickup optical system 40 allows the fluorescence light from the fluorescence light emitting element 30 to be incident on the dichroic mirror 22 in an approximately collimated state. Further, the first lens 41 and the second lens 42 of the second pickup optical system 40 also have a function of condensing the excitation light incident from the dichroic mirror 22, and allow the excitation light to be incident on the fluorescence light emitting element 30 in a condensed state. That is, the second condensing optical system 15 that condenses plural excitation lights emitted from the second light source 10 is formed by the second collimator lens array 13, the second condensing lens 20, the first collimating lens 21, the dichroic mirror 22, and the second pickup optical system 40.

In the second pickup optical system 40, the refractive index or the shape of a lens to be used is determined according to a spread of the fluorescence light output from the fluorescence light emitting element 30. Further, the number of lenses is not limited to two, and may be one, or three or more.

The fluorescence light emitting element 30 is a reflection-type fluorescence light emitting element that emits fluorescence light in the same direction as the incident direction of the excitation light. The fluorescence light emitting element 30 includes a phosphor layer 31, a substrate 33 that supports the phosphor layer 31, and a fixing member 32 that fixes the phosphor layer 31 to the substrate 33.

The phosphor layer 31 is fixedly supported on the substrate 33 by the fixing member 32 that connects the side surfaces of the phosphor layer 31 and the substrate 33. A surface of the phosphor layer 31 opposite to a side thereof to which the excitation light is incident is in contact with the substrate 33 through a reflecting film 35 to be described later.

Figure 2:
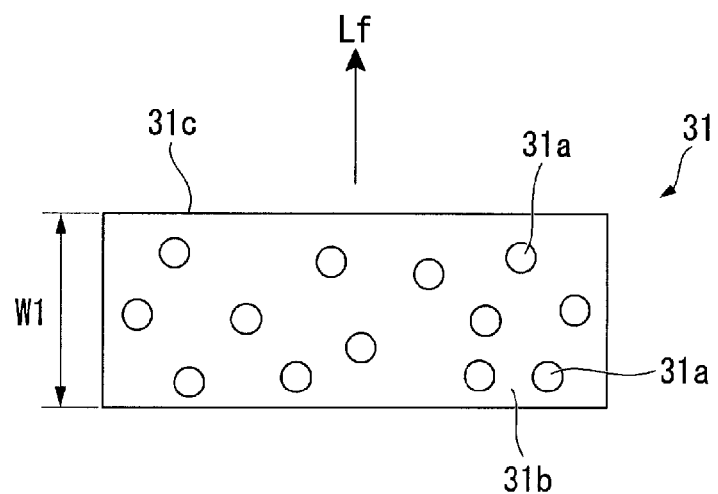
FIG. 2 is a diagram illustrating a cross section of a phosphor layer of the embodiment of the invention.

FIG. 2 is a diagram illustrating a cross section of the phosphor layer 31.

The phosphor layer 31 shown in FIG. 2 includes a binder 31b, and plural particles of phosphors 31a dispersed in the binder 31b.

A thickness W1 of the phosphor layer 31 is determined according to a required intensity of light of a fluorescence light Lf and a volume concentration of the phosphors 31a. That is, in order to increase the light intensity of the fluorescence light Lf under a condition that the volume concentration is kept constant, the thickness W1 of the phosphor layer 31 should be increased.

When comparing thermal resistances, in the thickness direction, of two phosphor layers having the same volume concentration but having different thicknesses W1, thermal conductivities of the two phosphor layers are the same, but the phosphor layer having the larger thickness W1 has a higher thermal resistance. In the present embodiment, the thermal resistance of the phosphor layer in the thickness direction is simply referred to as a thermal resistance.

In the present embodiment, the phosphor 31a is a phosphor that absorbs blue light (light emission intensity peak: about 450 nm) for excitation, for example. The fluorescence light Lf generated by the phosphor 31a is yellow light of 500 nm to 700 nm.

For example, a normally known YAG (yttrium aluminum garnet) phosphor may be used as the phosphor 31a. For example, a YAG phosphor of a composition indicated as (Y, Gd)$_3$(Al, Ga)$_5$O$_{12}$:Ce having an average particle diameter of 10 μm may be used as the phosphor 31a. The phosphors 31a may be formed by one type of material, or may be a mixture of particles formed by two or more types of materials.

The binder 31b is made of an inorganic material. The thermal conductivity of the binder 31b is larger than 1.88 times the thermal conductivity of the phosphor 31a. By setting the thermal conductivity of the binder 31b in this way, it is possible to increase the thermal conductivity of the phosphor layer 31, and to decrease the thermal resistance of the phosphor layer 31 or reduce the increase in the thermal resistance. This is a new finding experimentally obtained by the present inventors, of which the principle is as follows.

In order to decrease the volume concentration of the phosphors in the phosphor layer without changing the light emission intensity per unit area of the phosphor layer, the amount of the binder should be increased under a condition that the amount of the phosphors included in the phosphor layer per unit area is kept constant. Here, it is assumed that a binder having the same thermal conductivity as the thermal conductivity of the phosphor is used. In this case, the thermal conductivity of the phosphor layer is constant regardless of the amount of the binder. However, as the amount of the binder increases, in other words, as the phosphor concentration in the phosphor layer decreases, the thickness of the phosphor layer increases, and thus, the thermal resistance of the phosphor layer increases monotonically.

When the thermal conductivity of the binder is larger than one time the thermal conductivity of the phosphor and is smaller than or equal to 1.88 times the thermal conductivity of the phosphor, the degree that the thermal resistance of the phosphor layer increases as the thickness of the phosphor layer increases is larger than the degree that the thermal conductivity of the phosphor layer increases as the binder having the thermal conductivity larger than that of the phosphor is added to the phosphor layer. As a result, even though the binder having the thermal conductivity larger than that of the phosphor is added to the phosphor layer, the thermal resistance of the phosphor layer increases monotonically. On the other hand, by setting the thermal conductivity of the binder 31b to be larger than 1.88 times the thermal conductivity of the phosphor 31a, compared with a case where the phosphor layer is configured only by the phosphor 31a, it is possible to reduce the thermal resistance of the phosphor layer 31 or reduce the increase in the thermal resistance.

As the binder 31b having the above-described thermal conductivity, for example, a binder formed by at least one material selected from a group consisting of aluminum oxide, magnesium oxide, silicon carbide, and aluminum nitride may be used.

When the volume of the phosphors 31a included in the phosphor layer 31 is X and the volume of the binder 31b included in the phosphor layer 31 is Y, the ratio of the phosphors 31a to the binder 31b in the phosphor layer 31 becomes X/Y>1/2. That is, the volume ratio of the phosphors 31a to the entire volume of the phosphor layer 31 is set to be larger than 1/3. In other words, the volume concentration of the phosphors 31a to the phosphor layer 31 is set to be larger than about 33.3 vol %.

By setting the volume concentration of the phosphors 31a in this way, it is possible to reduce a decrease in use efficiency of the excitation light incident on the phosphor layer 31, and to obtain a sufficiently high light emission intensity.

In addition, when the volume concentration of the phosphors 31a is $\alpha$ [vol %], the thermal conductivity of the phosphor 31a is A, and the thermal conductivity of the binder 31b is B, the volume concentration of the phosphors 31a may be set to satisfy $\alpha \geq 2.4736 \times (B/A)^{-1.432} \times 100$ (Expression 1). By setting the volume concentration of the phosphors 31a in this way, it is possible to set the thermal resistance of the phosphor layer 31 formed by the phosphors 31a and the binder 31b to be lower than or equal to the thermal resistance of the phosphor layer that contains the phosphors 31a only. Here, as described above, B/A is larger than 1.88. The above-mentioned Expression (1) is a new finding experimentally obtained by the present inventors, of which the principle is as follows.

As described above, in a case where the volume concentration of the phosphors is decreased without changing the light emission intensity in a unit area in the phosphor layer, the thickness of the phosphor layer increases as the phosphor concentration decreases. Thus, there is a critical value of the volume concentration of the phosphors where the increase in the thermal conductivity due to the addition of the binder having the thermal conductivity larger than that of the phosphor to the phosphor layer and the increase in the thermal resistance due to the increase in the thickness of the phosphor layer are cancelled. That is, if the volume concentration of the phosphors is smaller than the critical value, the thermal resistance of the phosphor layer is larger than the thermal resistance of the phosphor layer that contains the phosphors 31a only.

In the following description, the critical value may be referred to as a phosphor concentration lower limit.

The right side of the Expression (1) represents a phosphor concentration lower limit using the ratio of the thermal conductivity A of the phosphor to the thermal conductivity B of the binder as a parameter. That is, by setting the volume concentration of the phosphors like the Expression (1), it is possible to set the thermal resistance of the phosphor layer 31 configured of the phosphors 31a and the binder 31b to be equal to or lower than the thermal resistance of the phosphor layer that contains the phosphors 31a only.

For example, when the aluminum oxide is selected as the binder 31b, a preferable volume concentration of the phosphors 31a is equal to or higher than 66 vol % according to the Expression (1).

In the present embodiment, since the phosphor layer 31 includes the phosphors 31a and the binder 31b, it is natural that the volume concentration of the phosphors 31a in the phosphor layer 31 is smaller than 100 vol %.

The thermal conductivity B of the binder capable of setting the thermal resistance of the phosphor layer 31 to be lower than or equal to the thermal resistance of the phosphor layer that contains the phosphors 31a only can be calculated using the Expression (1). That is, the thermal conductivity of the binder may be set so that the ratio of the thermal conductivity of the phosphor to the thermal conductivity of the binder is larger than the ratio B/A at which the value of the phosphor concentration lower limit is 100 vol %. In the Expression (1), the right side becomes 100 when B/A is about 1.88. Thus, B/A, that is, the ratio of the thermal conductivity of the binder to the thermal conductivity of the phosphor may be set to be larger than 1.88.

As shown in FIG. 1, on a surface of the phosphor layer 31 opposite to an upper surface 31c thereof on which the excitation light is incident, that is, on the surface thereof on the side of the substrate 33, a reflecting film 35 is provided. The reflecting film 35 has a characteristic of reflecting the fluorescence light generated in the phosphor layer 31.

As the fixing member 32, it is preferable to use an inorganic adhesive having a light reflection characteristic. In this case, it is possible to reflect light leaked from the side surfaces of the phosphor layer 31 into the phosphor layer 31 by the inorganic adhesive having the light reflection characteristic. Thus, it is possible to further increase light extraction efficiency of the fluorescence light generated in the phosphor layer 31.

On a surface of the substrate 33 opposite to the surface thereof that supports the phosphor layer 31, a heat sink 34 is arranged. The heat sink 34 is not particularly limited, and any known heat sink may be employed.

The excitation light (blue light) condensed by the first lens 41 and the second lens 42 is incident on the fluorescence light emitting element 30 from the upper surface 31c of the phosphor layer 31. The fluorescence light emitting element 30 emits yellow light generated by the phosphors 31a toward the same side as the side to which the excitation light is incident, that is, toward the side of the first lens 41.

The light emitted from the fluorescence light emitting element 30 is collimated by the second pickup optical system 40, and enters the dichroic mirror 22. The dichroic mirror 22 reflects and removes the excitation light (blue light) among the light incident from the second pickup optical system 40, and transmits green light and red light, that is, yellow light. Thus, the yellow light is emitted from the second light source device 100b.

Further, in the dichroic mirror 22, the blue light emitted from the first light source 50 is incident on the front surface thereof opposite to the surface thereof to which the light from the second pickup optical system 40 is incident, and the blue light emitted from the first light source 50 is reflected in the direction parallel to an optical axis of the light emitted from the second pickup optical system 40. Thus, the yellow light (green light and red light) emitted from the second pickup optical system 40 and the blue light emitted from the first pickup optical system 80 are combined to form white light.

The green light, the red light, and the blue light combined by the dichroic mirror 22 are incident on the fly-eye integrator 90 formed of a first fly-eye lens array 91 and a second fly-eye lens array 92, in which light intensity distribution thereof is made uniform. The green light, the red light, and the blue light emitted from the fly-eye integrator 90 are converted into linearly polarized light of which polarization directions are arranged in one direction by a polarization conversion element 93, are collimated by a second collimating lens 94, and are emitted from the illuminating device 100. Details of the fly-eye integrator 90 are disclosed, for example, in JP-A-8-304739, the content of which is incorporated herein by reference.

The color separation light guide optical system 200 includes a dichroic mirror 210, a dichroic mirror 220, a reflecting mirror 230, a reflecting mirror 240, a reflecting mirror 250, and a relay lens 260. The color separation light guide optical system 200 has a function of separating light from the illuminating device 100 into red light, green light and blue light, and guiding the red light, the green light and the blue light to the optical modulation device 400R, the optical modulation device 400G, and the optical modulation device 400B, respectively.

The dichroic mirror 210 and the dichroic mirror 220 are mirrors in which a wavelength selecting transmission film formed of a dielectric multilayer that reflects light of a predetermined wavelength region and transmits light of a different wavelength region is formed on a substrate. Specifically, the dichroic mirror 210 transmits a blue light component, and reflects a red light component and a green light component. The dichroic mirror 220 reflects the green light component, and transmits the red light component.

The reflecting mirror 230, the reflecting mirror 240, and the reflecting mirror 250 are mirrors that reflect incident light. Specifically, the reflecting mirror 230 reflects the blue light component that passes through the dichroic mirror 210. The reflecting mirror 240 and the reflecting mirror 250 reflect the red light component that passes through the dichroic mirror 220.

The blue light that passes through the dichroic mirror 210 reflects off the reflecting mirror 230, and enters an image forming region of the optical modulation device 400B for the blue light. The green light reflected by the dichroic mirror 210 is further reflected by the dichroic mirror 220, and enters an image forming region of the optical modulation device 400G for the green light. The red light that passes through the dichroic mirror 220 passes through the reflecting mirror 240 on the incident side, the relay lens 260, and the reflecting mirror 250 on the emission side, and enters an image forming region of the optical modulation device 400R for the red light.

The optical modulation device 400R, the optical modulation device 400G, and the optical modulation device 400B may employ normally known devices, and for example, may be configured of an optical modulation device such as a transmission-type liquid crystal light bulb that includes a liquid crystal element 410, and an incident side polarizing element 420 and an emission side polarizing element 430 with the liquid crystal element 410 being interposed therebetween. The incident side polarizing element 420 and the emission side polarizing element 430 have a configuration in which transmission axes thereof are orthogonal to each other (cross-Nicol configuration), for example.

The optical modulation device 400R, the optical modulation device 400G, and the optical modulation device 400B modulate incident color light according to image information to form color images, which become lighting targets of the illuminating device 100. The light modulation of the incident respective color lights is performed by the optical modulation device 400R, the optical modulation device 400G, and the optical modulation device 400B.

For example, the optical modulation device 400R, the optical modulation device 400G, and the optical modulation device 400B are transmission-type optical modulation devices in which liquid crystal is sealed between a pair of transparent substrates, and which modulate a polarization direction of one type of linearly polarized light emitted from the incident side polarizing element 420 according to given image information using a poly-silicon TFT as a switching element.

The cross dichroic prism 500 is an optical element that combines optical images obtained by the modulation of the respective color lights emitted from the emission side polarizing elements 430 to form a color image. The cross dichroic prism 500 is formed in a square shape in a planar view, in which four right-angle prisms are bonded. On approximately X-shaped interfaces where the right-angle prisms are bonded, a dielectric multi-layer film is formed. The dielectric multi-layer film formed on one interface among the approximately X-shaped interfaces reflects the red light, and the dielectric multi-layer film formed on the other interface reflects the blue light. The red light and the blue light are bent by the dielectric multi-layer films, and a travel direction of the red light and a travel direction of the blue light are aligned in a traveling direction of the green light, so that three color lights are combined.

The color image output from the cross dichroic prism 500 is enlarged and projected by the projection optical system 600 to form an image on a screen SCR.

According to the present embodiment, since the binder 31b of the phosphor layer 31 is formed of the inorganic material, the thermal conductivity of the binder 31b is higher than that of silicone resin, and thus, it is possible to reduce a decrease of the entire thermal conductivity of the phosphor layer 31.

Further, according to the present embodiment, since the thermal conductivity of the binder 31b is set to be larger than 1.88 times the thermal conductivity of the phosphors 31a, it is possible to reduce the thermal resistance of the phosphor layer 31 or reduce an increase in the thermal resistance thereof, compared with the case where the phosphor layer is configured of only the phosphors 31a.

Furthermore, according to the present embodiment, since the ratio of the volume of the phosphors 31a to the volume of the binder 31b is larger than 1/2, it is possible to reduce a decrease in use efficiency of the excitation light incident on the phosphor layer 31, and to reduce the thermal resistance of the phosphor layer 31 or reduce the increase in the thermal resistance thereof. Hereinafter, details thereof will be described.

Figure 3:
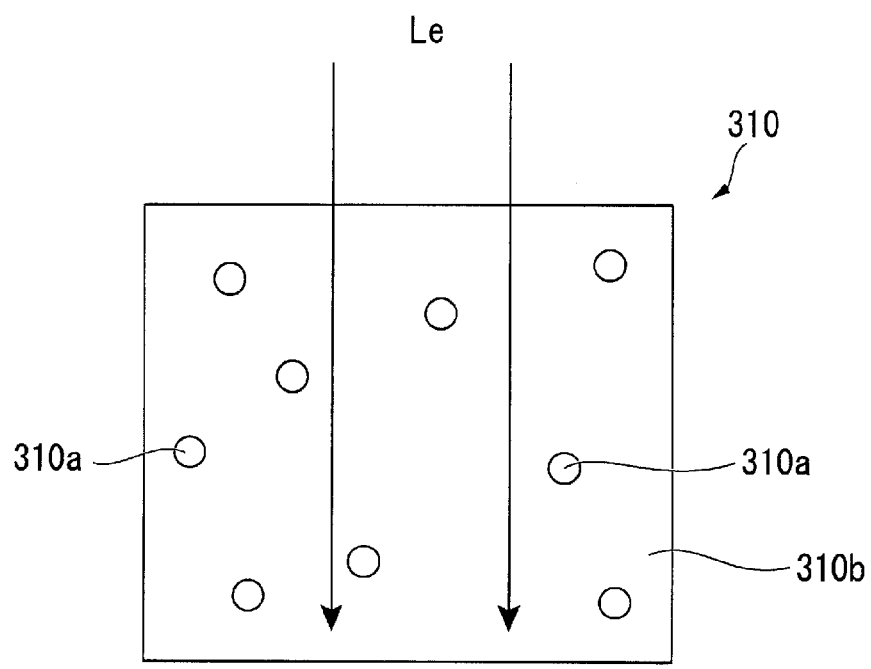
FIG. 3 is a cross-sectional view illustrating a phosphor layer having a low volume concentration of a phosphor.

FIG. 3 is a diagram illustrating a phosphor layer 310 having a low volume concentration of a phosphor 310a.

As shown in FIG. 3, when the volume concentration of the phosphor 310a with respect to the binder 310b is excessively small, the ratio of light that does not enter the phosphor 310a among the excitation light Le incident on the phosphor layer 310 increases. In such a case, the ratio of light converted into the fluorescence light among the excitation light Le incident on the phosphor layer 310 decreases, and thus, the use efficiency of the excitation light Le decreases. That is, even though the thermal conductivity of the phosphor layer is sufficiently high, the light emission intensity of the phosphor layer that has a low volume concentration of the phosphors may be low.

Further, if the volume concentration is lower than a predetermined values, the phosphors may be unevenly dispersed in the phosphor layer, even in the case of the volume concentration of the phosphors capable of reducing the decrease in the light emission intensity to some degree provided that the phosphors are uniformly dispersed in the phosphor layer. In this case, a portion (for example, a portion shown in FIG. 3) where the concentration of the phosphor particles is excessively low may easily occur. That is, when the volume concentration of the phosphors is not sufficient, the light emission characteristic is easily affected by the uneven dispersion of the phosphors in the phosphor layer.

In order to solve those problems, according to the present embodiment, the ratio of the volume of the phosphors 31a to the volume of the binder 31b is larger than 1/2, and thus, it is possible to make the volume concentration of the phosphors 31a in the phosphor layer 31 enough large. Thus, in a case where the phosphors are uniformly dispersed in the phosphor layer, and even in a case where the phosphors are unevenly dispersed in the phosphor layer, it is possible to reduce a decrease in the light emission characteristic of the phosphors.

As described above, according to the present embodiment, it is possible to reduce the decrease in the light emission characteristic of the phosphor layer, and to reduce the decrease in the thermal conductivity of the phosphor layer. As a result, according to the present embodiment, it is possible to obtain a fluorescence light emitting element capable of suppressing a temperature increase and reducing a decrease in the light emission intensity.

Further, as a method for manufacturing the phosphor layer, for example, a method for thinly cutting a thick and large flat plate (base material) formed by sintering a mixture of phosphors and a binder and individualizing the cut pieces to manufacture the phosphor layer may be used. In such a case, in manufacturing a phosphor layer having a low volume concentration of phosphors, it is difficult to uniformly disperse the phosphors in the base material when forming the base material. Thus, variation of the ratio of the phosphors included in the manufactured phosphor layer may be large, and thus, variation of a light emission characteristic of the manufactured phosphor layer may be large.

On the other hand, according to the present embodiment, as described above, since the ratio of the volume of the phosphors 31a to the volume of the binder 31b is larger than 1/2, it is possible to make the volume concentration of the phosphors 31a in the phosphor layer 31 enough large. Thus, it is possible to easily manufacture the base material in which the phosphors are uniformly dispersed, and thus, it is possible to reduce the variation of the light emission characteristic of the manufactured phosphor layer.

Further, according to the present embodiment, when the volume concentration of the phosphors 31a is $\alpha$ [vol %], the thermal conductivity of the phosphors 31a is A, and the thermal conductivity of the binder 31b is B, by setting the volume concentration of the phosphors 31a to satisfy $\alpha \geq 2.4736 \times (B/A)^{-1.432} \times 100$, it is possible to set the thermal resistance of the phosphor layer 31 to be lower than or equal to the thermal resistance in a case where the phosphor layer is configured of only the phosphors 31a.

Further, according to the present embodiment, since the fluorescence light emitting element 30 is provided, it is possible to obtain a light source device having excellent reliability.

Furthermore, according to the present embodiment, since the second light source device 100b is provided, it is possible to obtain a projector having excellent reliability.

In the present embodiment, the following configuration may be employed.

In the above-described embodiment, the phosphors 31a are included in the phosphor layer 31 as plural particles, but the invention is not limited thereto. In the present embodiment, for example, a configuration in which the phosphors are included in the phosphor layer in a marble shape may be used.

Further, in the above-described embodiment, the fluorescence light emitting element 30 is the reflection-type fluorescence light emitting element, but the invention is not limited thereto. In the present embodiment, a transmission-type fluorescence light emitting element may be used as the fluorescence light emitting element.

In addition, in the above-described embodiment, the phosphor layer 31 is supported on the substrate 33 fixed to the heat sink 34, but the invention is not limited thereto. The phosphor layer 31 may be provided on a substrate capable of being rotated around a rotational axis.

Furthermore, in the above-described embodiment, an example in which the light source device according to the invention is applied to a projector is shown, but the invention is not limited thereto. The light source device according to the invention may be applied to a headlight for an automobile, or the like.

EXAMPLES

Next, examples will be described. In the following examples, the YAG phosphor of the composition indicated as (Y, Gd)$_3$(Al, Ga)$_5$O$_{12}$:Ce having an average particle diameter of 10 μm was used as the phosphor. The thermal conductivity of the phosphor is 12 W/(mK).

Example 1

Phosphor layers in which phosphor concentrations Cf (vol %) in phosphor layers were 25 vol %, 30 vol %, 33.3 vol %, 35 vol %, 40 vol %, and 50 vol % were manufactured, and respective light emission characteristics were evaluated. The evaluation of the light emission characteristics of the phosphor layers was performed in consideration of an average value and a dispersion value in use efficiency of excitation light. Aluminum oxide was used as the binder. The thermal conductivity of the used aluminum oxide was 30 W/(mK). The result is shown in Table 1.

TABLE 1

| | Phosphor concentration Cf (vol %) | | | | | |
|---|---|---|---|---|---|---|
| | 50 | 40 | 35 | 33.3 (1:2) | 30 | 25 |
| Light emission characteristic of phosphor layer | ◯ | ◯ | ◯ | Δ | X | X |

As shown in Table 1, the light emission characteristics of the phosphor layers were evaluated in three stages of O, Δ and X for the respective phosphor concentrations Cf. In the case of the phosphor concentrations Cf of 25 vol % and 30 vol % in which the evaluation is X, it can be found that the average value of the use efficiency of the excitation light is small and the dispersion value of the use efficiency of the excitation light is large. In other words, when the phosphor concentration Cf is 25 vol % and 30 vol %, it can be found that a desired use efficiency of the excitation light cannot be obtained, and variation of the use efficiency of the excitation light in each manufactured phosphor layer is large.

In the case of the phosphor concentration Cf of 33.3 vol % in which the evaluation is Δ, that is, when the phosphor concentration Cf is 1/2 of the volume concentration of the binder, the average value of the use efficiency of the excitation light is close to the desired value compared with a case where the phosphor concentration Cf is 25 vol % and 30 vol %, but it can be found that the dispersion value is similarly large and the variation of the light emission characteristic of the phosphor layer is large.

In the case of the phosphor concentrations Cf of 35 vol %, 40 vol %, and 50 vol % in which the evaluation is O, it can be found that the average value of the use efficiency of the excitation light is large and the dispersion value of the use efficiency of the excitation light is small. In other words, when the phosphor concentration Cf is 35 vol %, 40 vol %, and 50 vol %, it can be found that the use efficiency of the excitation light can be set to the desired value, and the variation of the use efficiency of the excitation light in the phosphor layer can be set to be small.

As described above, as the volume concentration of the phosphors with respect to the volume concentration of the binder is larger than 1/2, that is, as the phosphor concentration Cf is larger than 33.3 vol %, it is possible to reduce the decrease in the use efficiency of the excitation light, and to reduce the variation of the light emission characteristic of the phosphor layer.

Example 2

Next, a change in the thermal resistance (° C./W) due to a change in the phosphor concentration Cf in the phosphor layer was measured for a case where the binder was made of aluminum oxide and a case where the binder was made of magnesium oxide. The thermal conductivity of the used magnesium oxide was 57 W/(mK). The thermal resistance is obtained by multiplying an inverse number of the thermal conductivity of the entire phosphor layer by the thickness of the phosphor layer.

By adding the binder to a predetermined amount of phosphors, samples having different phosphor concentrations Cf were prepared. The samples were prepared such that the area of the surface through which the light is output in the phosphor layer is identical and the thickness of the phosphor layer is increased according to the amount of the added binder. That is, the phosphor concentration Cf was changed so that the light emission intensity per a unit area of the surface through which the light is output is identical. Thus, for example, when the phosphor concentration Cf is 50 vol %, the thickness of the phosphor layer has a thickness of two times the thickness in a case where the binder is not included in the phosphor layer, that is, in a case where the phosphor layer is configured of only the phosphors.

Further, samples having different phosphor concentrations Cf were prepared for two kinds of amount of phosphor for each binder.

Figure 4:
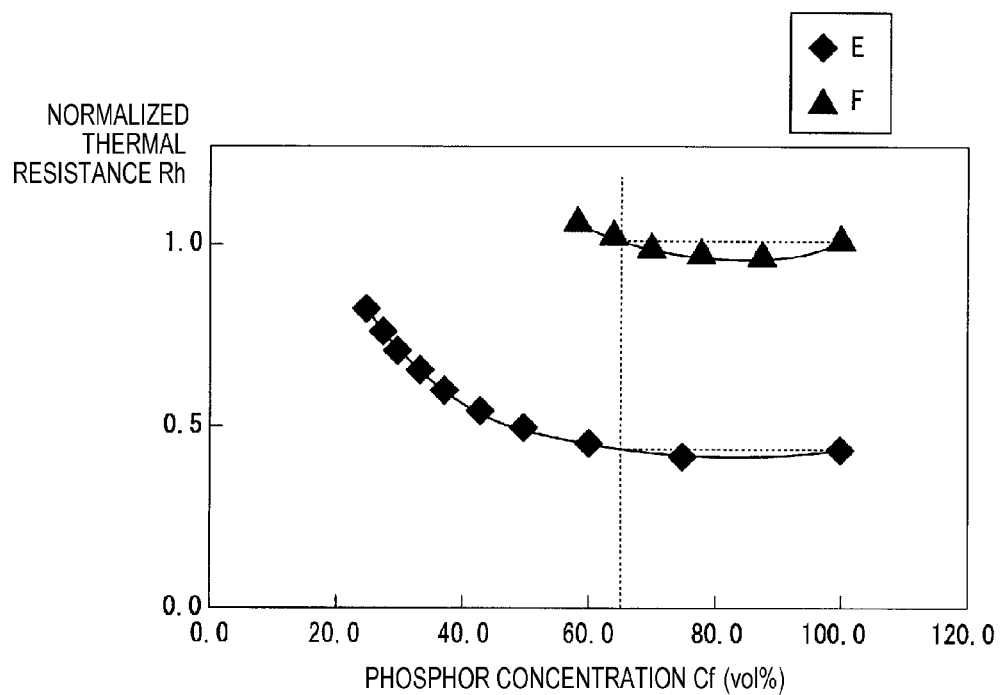
FIG. 4 is a graph illustrating change in the thermal resistance of a phosphor layer when aluminum oxide is used as a binder.
Figure 5:
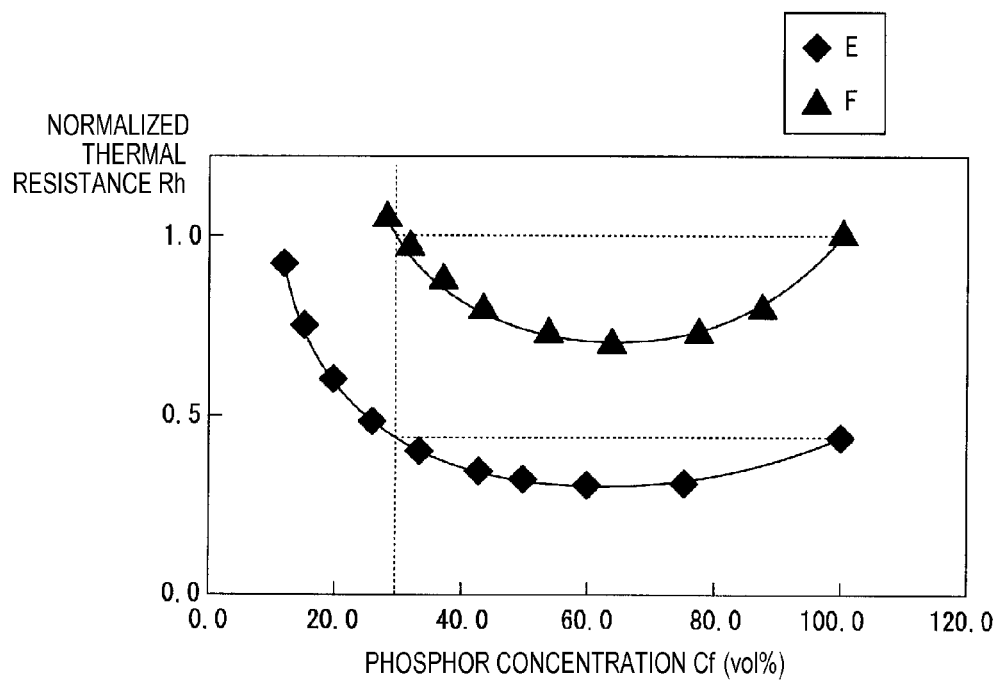
FIG. 5 is a graph illustrating change in the thermal resistance of a phosphor layer when magnesium oxide is used as a binder.

FIG. 4 is a graph illustrating a measurement result when aluminum oxide is used as a binder. FIG. 5 is a graph illustrating a measurement result when magnesium oxide is used as a binder. In FIGS. 4 and 5, E and F correspond to the amount of the phosphors included in the phosphor layer, and the amount of the phosphors in a sample indicated by E is smaller than the amount of the phosphors in a sample indicated by F. Further, a longitudinal axis represents normalized thermal resistance Rh, and a transverse axis represents the phosphor concentration Cf. The normalized thermal resistance Rh is obtained by normalizing a measurement value of thermal resistance using thermal resistance of the sample F, which has a larger amount of phosphors, at the phosphor concentration Cf of 100 vol %. In the following description, the normalized thermal resistance Rh is simply referred to as "thermal resistance Rh".

If the phosphor concentration Cf decreases, the thermal conductivity of the entire phosphor layer increases monotonically. However, as shown in FIGS. 4 and 5, it can be found that if the phosphor concentration Cf decreases, that is, if the ratio of the binder increases, the thermal resistance Rh first drops but rises from a certain point to then become larger than the value of the thermal resistance Rh that is obtained when the phosphor concentration Cf is 100 vol %.

The value of the phosphor concentration Cf in which the value of the thermal resistance Rh again becomes equal to the value of the thermal resistance Rh that is obtained when the phosphor concentration Cf is 100 vol % is a value, that is, a concentration lower limit CU where the increase in the thermal conductivity due to adding the binder having a thermal conductivity larger than that of the phosphor to the phosphor layer and the increase in the thermal resistance due to increasing the thickness of the phosphor layer are cancelled. As shown in FIG. 4, the concentration lower limit CU of the phosphors when aluminum oxide is used as the binder is about 66 vol %. Further, as shown in FIG. 5, the concentration lower limit CU of the phosphors when magnesium oxide is used as the binder is about 30 vol %.

That is, it can be found that by setting the phosphor concentration Cf to be equal to or higher than 66 vol % when aluminum oxide is selected as the binder, and by setting the phosphor concentration Cf to be equal to or higher than 30 vol % when magnesium oxide is used as the binder, the thermal resistance of the phosphor layer can be set to be equal to or lower than the thermal resistance of the phosphor layer that contains the phosphors only. Here, in the case of the magnesium oxide, as described in Example 1, since the light emission characteristic of the phosphor layer decreases when the phosphor concentration Cf is 33.3 vol % or less, it is preferable that the phosphor concentration Cf is larger than 33.3 vol %.

Figure 6:
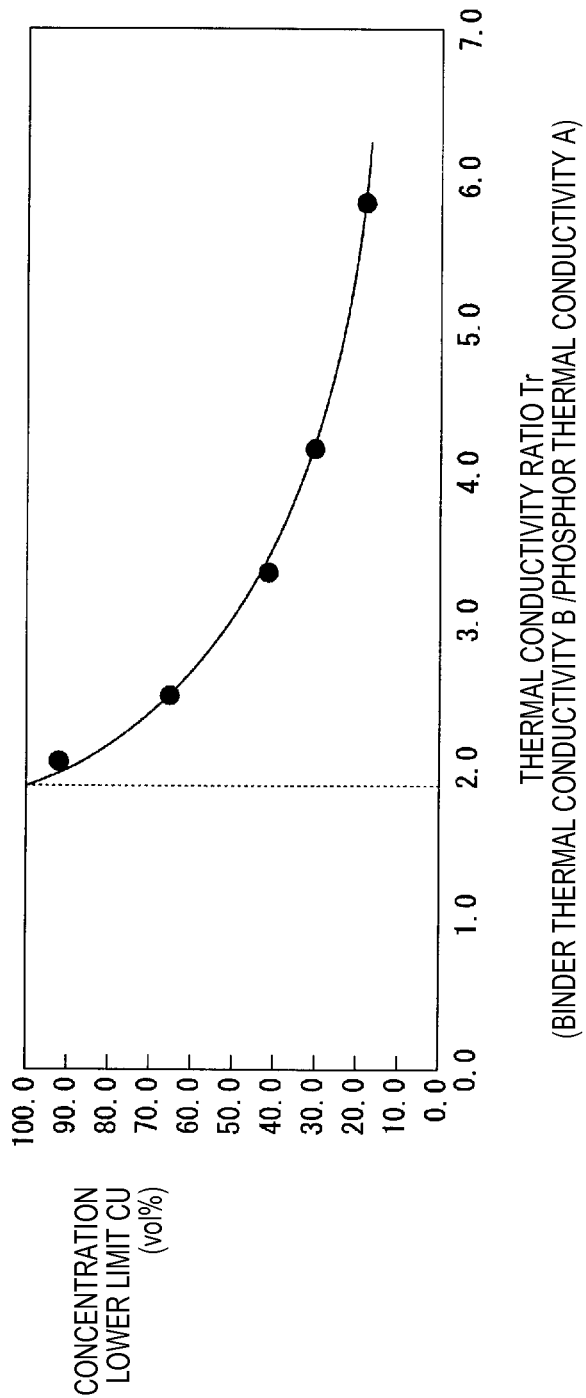
FIG. 6 is a graph illustrating change in a phosphor concentration lower limit with respect to a thermal conductivity ratio.

The concentration lower limit CU obtained in this way is plotted for each value of the thermal conductivity ratio Tr (=B/A) that is the ratio of the thermal conductivity B of the binder to the thermal conductivity A of the phosphor. The result is shown in FIG. 6. In FIG. 6, a longitudinal axis represents the concentration lower limit CU, and a transverse axis represents the thermal conductivity ratio Tr. Further, a curve shown in FIG. 6 is a curve indicated by an expression of $CU=2.4736 \times Tr^{-1.432} \times 100$.

As shown in FIG. 6, it can be found that the plot of the concentration lower limit CU lies along the curve indicated by the expression of $CU=2.4736 \times Tr^{-1.432} \times 100$. Thus, it was confirmed that when the volume concentration of the phosphors is denoted by α [vol %], by setting the volume concentration of the phosphors to satisfy $\alpha \geq 2.4736 \times Tr^{-1.432} \times 100$, it is possible to make the thermal resistance of the phosphor layer to be equal to or lower than the thermal resistance of the phosphor layer that contains the phosphors only.

According to the above-described expression, the concentration lower limit CU becomes about 100 vol % when the thermal conductivity ratio Tr is about 1.88. Consequently, it was confirmed that by setting the thermal conductivity ratio Tr to be larger than 1.88, it is possible to make the thermal resistance of the phosphor layer to be equal to or lower than the thermal resistance of the phosphor layer that contains the phosphors only. In other words, it can be confirmed that, when the binder is mixed with the phosphor layer, by setting the thermal conductivity of the binder to be larger than 1.88 times the thermal conductivity of the phosphors, it is possible to make the thermal resistance of the phosphor layer to be equal to or lower than the thermal resistance of the phosphor layer that contains the phosphors only.

As understood from FIG. 4, when aluminum oxide is used as the binder, the thermal resistance shows approximately the minimum value when the phosphor concentration Cf is about 83 vol %, regardless of the amount of the phosphors included in the phosphor layer. Further, when the phosphor concentration Cf is about 75 vol % or more and about 95 vol % or less, a sufficiently low thermal resistance is obtained. Accordingly, when aluminum oxide is used as the binder, it is preferable that the phosphor concentration Cf be set to 75 vol % or more and 95 vol % or less.

Further, as understood from FIG. 5, when magnesium oxide is used as the binder, the thermal resistance shows approximately the minimum value when the phosphor concentration Cf is about 66 vol %, regardless of the amount of the phosphors included in the phosphor layer. When magnesium oxide is used as the binder, it is preferable that the phosphor concentration Cf be set to about 35 vol % or more. Further, when the phosphor concentration Cf is about 50 vol % or more and about 80 vol % or less, a sufficiently low thermal resistance is obtained. Accordingly, it is more preferable that the phosphor concentration Cf be set to 50 vol % or more and 80 vol % or less.

In the above-described examples, aluminum oxide or magnesium oxide is used as the binder, but the invention is not limited thereto. Any material capable of setting the thermal conductivity ratio Tr to be larger than 1.88 may be used as the binder recited in the present invention. For example, silicon carbide having a thermal conductivity of 200 W/(mK) or aluminum nitride having a thermal conductivity of 285 W/(mK) may be used. Further, a mixture that includes a material selected from a group consisting of aluminum oxide, magnesium oxide, silicon carbide, and aluminum nitride may be used as the binder.

CROSS REFERENCE TO RELATED APPLICATIONS

This application claims priority to Japanese Patent Application No. 2013-226261 filed on Oct. 31, 2013, the entire contents of which are incorporated by reference herein.

What is claimed is:

1. A fluorescence light emitting element comprising:
a phosphor layer that includes phosphors and a binder made of an inorganic material,
wherein a thermal conductivity B of the binder is larger than 1.88 times a thermal conductivity A of the phosphors, and
a relationship of X/Y>1/2 is satisfied, where X denotes a volume of the phosphors included in the phosphor layer, and Y denotes a volume of the binder included in the phosphor layer.

2. The fluorescence light emitting element according to claim 1,
wherein a relationship of $\alpha \geq 2.4736 \times (B/A)^{-1.432} \times 100$ is satisfied, where $\alpha$ [vol %] denotes a volume concentration of the phosphors included in the phosphor layer.

3. The fluorescence light emitting element according to claim 1,
wherein the binder is selected from a group consisting of aluminum oxide, magnesium oxide, silicon carbide, and aluminum nitride.

4. The fluorescence light emitting element according to claim 1,
wherein the binder is made of aluminum oxide, and
a volume concentration of the phosphors is 66 vol % or more.

5. The fluorescence light emitting element according to claim 4,
wherein the volume concentration of the phosphors is 75 vol % or more and 95 vol % or less.

6. The fluorescence light emitting element according to claim 1,
wherein the binder is made of magnesium oxide, and
a volume concentration of the phosphors is 50 vol % or more and 80 vol % or less.

7. A light source device comprising the fluorescence light emitting element according to claim 1.

8. A light source device comprising the fluorescence light emitting element according to claim 2.

9. A light source device comprising the fluorescence light emitting element according to claim 3.

10. A light source device comprising the fluorescence light emitting element according to claim 4.

11. A light source device comprising the fluorescence light emitting element according to claim 5.

12. A light source device comprising the fluorescence light emitting element according to claim 6.

13. A projector comprising:
the light source device according to claim 7;
an optical modulation device that modulates light emitted from the light source device to form image light; and
a projection optical system that projects light emitted from the optical modulation device.

14. A projector comprising:
the light source device according to claim 8;
an optical modulation device that modulates light emitted from the light source device to form image light; and
a projection optical system that projects light emitted from the optical modulation device.

15. A projector comprising:
the light source device according to claim 9;
an optical modulation device that modulates light emitted from the light source device to form image light; and
a projection optical system that projects light emitted from the optical modulation device.

16. A projector comprising:
the light source device according to claim 10;
an optical modulation device that modulates light emitted from the light source device to form image light; and
a projection optical system that projects light emitted from the optical modulation device.

17. A projector comprising:
the light source device according to claim 11;
an optical modulation device that modulates light emitted from the light source device to form image light; and
a projection optical system that projects light emitted from the optical modulation device.

18. A projector comprising:
the light source device according to claim 12;
an optical modulation device that modulates light emitted from the light source device to form image light; and
a projection optical system that projects light emitted from the optical modulation device.

\* \* \* \* \*